US011517975B2

(12) United States Patent
Fager et al.

(10) Patent No.: US 11,517,975 B2
(45) Date of Patent: Dec. 6, 2022

(54) ENHANCED ELECTRON BEAM GENERATION

(71) Applicant: Arcam AB, Moelndal (SE)

(72) Inventors: Mattias Fager, Onsala (SE); Johan Backlund, Onsala (SE)

(73) Assignee: Arcam AB, Moelndal (SE)

( * ) Notice: Subject to any disclaimer, the term of this patent is extended or adjusted under 35 U.S.C. 154(b) by 1052 days.

(21) Appl. No.: 16/195,970

(22) Filed: Nov. 20, 2018

(65) Prior Publication Data

US 2019/0193192 A1 Jun. 27, 2019

Related U.S. Application Data

(60) Provisional application No. 62/609,396, filed on Dec. 22, 2017.

(51) Int. Cl.
*H01J 37/147* (2006.01)
*H01J 37/10* (2006.01)
(Continued)

(52) U.S. Cl.
CPC .......... *B23K 15/0086* (2013.01); *B22F 10/20* (2021.01); *B23K 15/002* (2013.01); *B23K 15/0026* (2013.01); *B23K 15/0046* (2013.01); *B23K 15/06* (2013.01); *B29C 64/153* (2017.08); *B29C 64/268* (2017.08); *B29C 64/393* (2017.08); *B33Y 10/00* (2014.12);
(Continued)

(58) Field of Classification Search
CPC ......... H01J 37/147; H01J 37/10; H01J 37/063
See application file for complete search history.

(56) References Cited

U.S. PATENT DOCUMENTS 2,264,968 A 12/1941 De Forest
2,323,715 A 7/1943 Kuehni
(Continued)

FOREIGN PATENT DOCUMENTS

CA 2860188 A1 6/2006
CN 101607311 A 12/2009
(Continued)

OTHER PUBLICATIONS

Cheah, Chi-Mun, et al., "Automatic Algorithm for Generating Complex Polyhedral Scaffold Structure for Tissue Engineering", Tissue Engineering, 2004, pp. 595-610, vol. 10, No. 3/4, XP002691483.
(Continued)

*Primary Examiner* — Joseph L Williams
(74) *Attorney, Agent, or Firm* — Dinsmore & Shohl LLP (57) ABSTRACT

An electron beam source including a cathode, an anode, a means for deflecting an electron beam over a target surface and at least one vacuum pump, the electron beam source further including a contraction area arranged between the anode and the means for deflecting the electron beam where a hole in the contraction area is aligned with a hole in the anode with respect to the cathode, a first vacuum pump is arranged between the contraction area and the anode and a second vacuum pump is arranged above the anode, a gas inlet is provided between the contraction area and the means for deflecting the electron beam, wherein a first crossover of the electron beam is arranged between the cathode and the anode and a second crossover is arranged at or in close proximity to the contraction area.

20 Claims, 5 Drawing Sheets

(51) Int. Cl.

| | | |
|---|---|---|
| *H01J 37/063* | (2006.01) | |
| *B23K 15/00* | (2006.01) | |
| *H01J 37/18* | (2006.01) | |
| *H01J 37/09* | (2006.01) | |
| *B33Y 10/00* | (2015.01) | |
| *B33Y 30/00* | (2015.01) | |
| *B23K 15/06* | (2006.01) | |
| *B33Y 50/02* | (2015.01) | |
| *B29C 64/153* | (2017.01) | |
| *B29C 64/268* | (2017.01) | |
| *H01J 37/304* | (2006.01) | |
| *B29C 64/393* | (2017.01) | |
| *H01J 37/301* | (2006.01) | |
| *B22F 10/20* | (2021.01) | |
| *B22F 10/30* | (2021.01) | |

(52) U.S. Cl.
CPC ............ *B33Y 30/00* (2014.12); *B33Y 50/02* (2014.12); *H01J 37/063* (2013.01); *H01J 37/09* (2013.01); *H01J 37/10* (2013.01); *H01J 37/147* (2013.01); *H01J 37/18* (2013.01); *H01J 37/301* (2013.01); *H01J 37/3045* (2013.01); *B22F 10/30* (2021.01); *H01J 2237/188* (2013.01); *H01J 2237/1825* (2013.01); *H01J 2237/316* (2013.01); *H01J 2237/3128* (2013.01)

(56) References Cited

U.S. PATENT DOCUMENTS

| | | | |
|---|---|---|---|
| 3,634,644 A | 1/1972 | Ogden et al. | |
| 3,838,496 A | 10/1974 | Kelly | |
| 3,882,477 A | 5/1975 | Mueller | |
| 3,906,229 A | 9/1975 | Demeester et al. | |
| 3,908,124 A | 9/1975 | Rose | |
| 4,314,134 A | 2/1982 | Schumacher et al. | |
| 4,348,576 A | 9/1982 | Anderl et al. | |
| 4,352,565 A | 10/1982 | Rowe et al. | |
| 4,401,719 A | 8/1983 | Kobayashi et al. | |
| 4,541,055 A | 9/1985 | Wolfe et al. | |
| 4,651,002 A | 3/1987 | Anno | |
| 4,818,562 A | 4/1989 | Arcella et al. | |
| 4,863,538 A | 9/1989 | Deckard | |
| 4,888,490 A | 12/1989 | Bass et al. | |
| 4,927,992 A | 5/1990 | Whitlow et al. | |
| 4,958,431 A | 9/1990 | Clark et al. | |
| 4,988,844 A | 1/1991 | Dietrich et al. | |
| 5,118,192 A | 6/1992 | Chen et al. | |
| 5,135,695 A | 8/1992 | Marcus | |
| 5,167,989 A | 12/1992 | Dudek et al. | |
| 5,182,170 A | 1/1993 | Marcus et al. | |
| 5,204,055 A | 4/1993 | Sachs et al. | |
| 5,247,560 A | 9/1993 | Hosokawa et al. | |
| 5,393,482 A | 2/1995 | Benda et al. | |
| 5,483,036 A | 1/1996 | Giedt et al. | |
| 5,508,489 A | 4/1996 | Benda et al. | |
| 5,511,103 A | 4/1996 | Hasegawa | |
| 5,595,670 A | 1/1997 | Mombo Caristan | |
| 5,647,931 A | 7/1997 | Retallick et al. | |
| 5,753,274 A | 5/1998 | Wilkening et al. | |
| 5,837,960 A | 11/1998 | Lewis et al. | |
| 5,876,550 A | 3/1999 | Feygin et al. | |
| 5,904,890 A | 5/1999 | Lohner et al. | |
| 5,932,290 A | 8/1999 | Lombardi et al. | |
| 6,046,426 A | 4/2000 | Jeantette et al. | |
| 6,162,378 A | 12/2000 | Bedal et al. | |
| 6,204,469 B1 | 3/2001 | Fields et al. | |
| 6,419,203 B1 | 7/2002 | Dang | |
| 6,537,052 B1 | 3/2003 | Adler | |
| 6,554,600 B1 | 4/2003 | Hofmann et al. | |
| 6,583,379 B1 | 6/2003 | Meiners et al. | |
| 6,676,892 B2 | 1/2004 | Das et al. | |
| 6,724,001 B1 | 4/2004 | Pinckney et al. | |
| 6,746,506 B2 | 6/2004 | Liu et al. | |
| 6,751,516 B1 | 6/2004 | Richardson | |
| 6,764,636 B1 | 7/2004 | Allanic et al. | |
| 6,811,744 B2 | 11/2004 | Keicher et al. | |
| 6,815,636 B2 | 11/2004 | Chung et al. | |
| 6,824,714 B1 | 11/2004 | Türck et al. | |
| 7,003,864 B2 | 2/2006 | Dirscherl | |
| 7,020,539 B1 | 3/2006 | Kovacevic et al. | |
| 7,165,498 B2 | 1/2007 | Mackrill et al. | |
| 7,204,684 B2 | 4/2007 | Ederer et al. | |
| 7,291,002 B2 | 11/2007 | Russell et al. | |
| 7,452,500 B2 | 11/2008 | Uckelmann | |
| 7,454,262 B2 | 11/2008 | Larsson et al. | |
| 7,537,722 B2 | 5/2009 | Andersson et al. | |
| 7,540,738 B2 | 6/2009 | Larsson et al. | |
| 7,569,174 B2 | 8/2009 | Ruatta et al. | |
| 7,635,825 B2 | 12/2009 | Larsson | |
| 7,686,605 B2 | 3/2010 | Perret et al. | |
| 7,696,501 B2 | 4/2010 | Jones | |
| 7,713,454 B2 | 5/2010 | Larsson | |
| 7,754,135 B2 | 7/2010 | Abe et al. | |
| 7,799,253 B2 | 9/2010 | Höchsmann et al. | |
| 7,871,551 B2 | 1/2011 | Wallgren et al. | |
| 8,021,138 B2 | 9/2011 | Green | |
| 8,083,513 B2 | 12/2011 | Montero-Escuder et al. | |
| 8,137,739 B2 | 3/2012 | Philippi et al. | |
| 8,187,521 B2 | 5/2012 | Larsson et al. | |
| 8,308,466 B2 | 11/2012 | Ackelid et al. | |
| 8,992,816 B2 | 3/2015 | Jonasson et al. | |
| 9,073,265 B2 | 7/2015 | Snis | |
| 9,079,248 B2 | 7/2015 | Ackelid | |
| 9,126,167 B2 | 9/2015 | Ljungblad | |
| 9,254,535 B2 | 2/2016 | Buller et al. | |
| 9,310,188 B2 | 4/2016 | Snis | |
| 9,505,172 B2 | 11/2016 | Ljungblad | |
| 9,550,207 B2 | 1/2017 | Ackelid | |
| 9,802,253 B2 | 10/2017 | Jonasson | |
| 9,950,367 B2 | 4/2018 | Backlund et al. | |
| 10,071,422 B2 | 9/2018 | Buller et al. | |
| 2002/0104973 A1 | 8/2002 | Kerekes | |
| 2002/0152002 A1 | 10/2002 | Lindemann et al. | |
| 2002/0195747 A1 | 12/2002 | Hull et al. | |
| 2003/0043360 A1 | 3/2003 | Farnworth | |
| 2003/0133822 A1 | 7/2003 | Harryson | |
| 2003/0205851 A1 | 11/2003 | Laschutza et al. | |
| 2004/0012124 A1 | 1/2004 | Li et al. | |
| 2004/0026807 A1 | 2/2004 | Andersson et al. | |
| 2004/0084814 A1 | 5/2004 | Boyd et al. | |
| 2004/0104499 A1 | 6/2004 | Keller | |
| 2004/0148048 A1 | 7/2004 | Farnworth | |
| 2004/0173496 A1 | 9/2004 | Srinivasan | |
| 2004/0173946 A1 | 9/2004 | Pfeifer et al. | |
| 2004/0204765 A1 | 10/2004 | Fenning et al. | |
| 2004/0217095 A1 | 11/2004 | Herzog | |
| 2005/0173380 A1 | 8/2005 | Carbone | |
| 2005/0186538 A1 | 8/2005 | Uckelmann | |
| 2005/0282300 A1 | 12/2005 | Yun et al. | |
| 2006/0108712 A1 | 5/2006 | Mattes | |
| 2006/0138325 A1 | 6/2006 | Choi | |
| 2006/0145381 A1 | 7/2006 | Larsson | |
| 2006/0147332 A1 | 7/2006 | Jones et al. | |
| 2006/0157892 A1 | 7/2006 | Larsson | |
| 2006/0180957 A1 | 8/2006 | Hopkinson et al. | |
| 2006/0284088 A1 | 12/2006 | Fukunaga et al. | |
| 2007/0074659 A1 | 4/2007 | Wahlstrom | |
| 2007/0175875 A1 | 8/2007 | Uckelmann et al. | |
| 2007/0179655 A1 | 8/2007 | Farnworth | |
| 2007/0182289 A1 | 8/2007 | Kigawa et al. | |
| 2007/0298182 A1 | 12/2007 | Perret et al. | |
| 2008/0236738 A1 | 10/2008 | Lo et al. | |
| 2009/0017219 A1 | 1/2009 | Paasche et al. | |
| 2009/0152771 A1 | 6/2009 | Philippi et al. | |
| 2009/0206056 A1 | 8/2009 | Xu et al. | |
| 2010/0007062 A1 | 1/2010 | Larsson et al. | |
| 2010/0260410 A1 | 10/2010 | Taminger et al. | |
| 2010/0305743 A1 | 12/2010 | Larsson | |
| 2010/0310404 A1 | 12/2010 | Ackelid | |
| 2010/0316856 A1 | 12/2010 | Currie et al. | |

(56) References Cited

U.S. PATENT DOCUMENTS

| | | |
|---|---|---|
| 2011/0061591 A1 | 3/2011 | Stecker |
| 2011/0114839 A1 | 5/2011 | Stecker et al. |
| 2011/0133367 A1 | 6/2011 | Weidinger et al. |
| 2011/0240607 A1 | 10/2011 | Stecker et al. |
| 2011/0241575 A1 | 10/2011 | Caiafa et al. |
| 2011/0293770 A1 | 12/2011 | Ackelid et al. |
| 2011/0293771 A1 | 12/2011 | Oberhofer et al. |
| 2011/0309554 A1 | 12/2011 | Liska et al. |
| 2011/0316178 A1 | 12/2011 | Uckelmann |
| 2012/0100031 A1 | 4/2012 | Ljungblad |
| 2012/0164322 A1 | 6/2012 | Teulet et al. |
| 2012/0183701 A1 | 7/2012 | Pilz et al. |
| 2012/0193530 A1 | 8/2012 | Parker et al. |
| 2012/0211155 A1 | 8/2012 | Wehning et al. |
| 2012/0223059 A1 | 9/2012 | Ackelid |
| 2012/0225210 A1 | 9/2012 | Fruth |
| 2012/0237745 A1 | 9/2012 | Dierkes et al. |
| 2012/0266815 A1 | 10/2012 | Brunermer |
| 2013/0029206 A1 | 1/2013 | Lev |
| 2013/0055568 A1 | 3/2013 | Dusel et al. |
| 2013/0162134 A1 | 6/2013 | Mattausch et al. |
| 2013/0186514 A1 | 7/2013 | Zhuang et al. |
| 2013/0216959 A1 | 8/2013 | Tanaka et al. |
| 2013/0233846 A1 | 9/2013 | Jakimov et al. |
| 2013/0264750 A1 | 10/2013 | Hofacker et al. |
| 2013/0270750 A1 | 10/2013 | Green |
| 2013/0278920 A1 | 10/2013 | Loewgren |
| 2013/0300286 A1 | 11/2013 | Ljungblad et al. |
| 2013/0343947 A1 | 12/2013 | Satzger et al. |
| 2014/0175708 A1 | 6/2014 | Echigo et al. |
| 2014/0271964 A1 | 9/2014 | Roberts, IV et al. |
| 2014/0301884 A1 | 10/2014 | Hellestam et al. |
| 2014/0308153 A1 | 10/2014 | Ljungblad |
| 2014/0314609 A1 | 10/2014 | Ljungblad et al. |
| 2014/0314964 A1 | 10/2014 | Ackelid |
| 2014/0348691 A1 | 11/2014 | Ljungblad et al. |
| 2014/0363327 A1 | 12/2014 | Holcomb |
| 2014/0367367 A1 | 12/2014 | Wood et al. |
| 2015/0004045 A1 | 1/2015 | Ljungblad |
| 2015/0050463 A1 | 2/2015 | Nakano et al. |
| 2015/0071809 A1 | 3/2015 | Nordkvist et al. |
| 2015/0086409 A1 | 3/2015 | Hellestam |
| 2015/0088295 A1 | 3/2015 | Hellestam |
| 2015/0130118 A1 | 5/2015 | Cheng et al. |
| 2015/0139849 A1 | 5/2015 | Pialot, Jr. et al. |
| 2015/0151490 A1 | 6/2015 | Jonasson et al. |
| 2015/0165524 A1 | 6/2015 | Ljungblad et al. |
| 2015/0165525 A1 | 6/2015 | Jonasson |
| 2015/0174658 A1 | 6/2015 | Ljungblad |
| 2015/0174695 A1 | 6/2015 | Elfstroem et al. |
| 2015/0251249 A1 | 9/2015 | Fager |
| 2015/0273622 A1 | 10/2015 | Manabe |
| 2015/0283610 A1 | 10/2015 | Ljungblad et al. |
| 2015/0283613 A1 | 10/2015 | Backlund et al. |
| 2015/0290710 A1 | 10/2015 | Ackelid |
| 2015/0306819 A1 | 10/2015 | Ljungblad |
| 2016/0052056 A1 | 2/2016 | Fager |
| 2016/0052079 A1 | 2/2016 | Ackelid |
| 2016/0054115 A1 | 2/2016 | Snis |
| 2016/0054121 A1 | 2/2016 | Snis |
| 2016/0054347 A1 | 2/2016 | Snis |
| 2016/0059314 A1 | 3/2016 | Ljungblad et al. |
| 2016/0129501 A1 | 5/2016 | Loewgren et al. |
| 2016/0167160 A1 | 6/2016 | Hellestam |
| 2016/0167303 A1 | 6/2016 | Petelet |
| 2016/0202042 A1 | 7/2016 | Snis |
| 2016/0202043 A1 | 7/2016 | Snis |
| 2016/0211116 A1 | 7/2016 | Lock |
| 2016/0236279 A1 | 8/2016 | Ashton et al. |
| 2016/0279735 A1 | 9/2016 | Hellestam |
| 2016/0282848 A1 | 9/2016 | Hellestam |
| 2016/0303687 A1 | 10/2016 | Ljungblad |
| 2016/0307731 A1 | 10/2016 | Lock |
| 2016/0311021 A1 | 10/2016 | Elfstroem et al. |
| 2016/0332228 A1 | 11/2016 | Mackie et al. |
| 2017/0080494 A1 | 3/2017 | Ackelid |
| 2017/0087661 A1 | 3/2017 | Backlund et al. |
| 2017/0106443 A1 | 4/2017 | Karlsson |
| 2017/0106570 A1 | 4/2017 | Karlsson |
| 2017/0136541 A1 | 5/2017 | Fager |
| 2017/0136542 A1 | 5/2017 | Nordkvist et al. |
| 2017/0173691 A1 | 6/2017 | Jonasson |
| 2017/0189964 A1 | 7/2017 | Backlund et al. |
| 2017/0227417 A1 | 8/2017 | Snis |
| 2017/0227418 A1 | 8/2017 | Snis |
| 2017/0246684 A1 | 8/2017 | Hellestam |
| 2017/0246685 A1 | 8/2017 | Hellestam |
| 2017/0259338 A1 | 9/2017 | Ackelid |
| 2017/0282248 A1 | 10/2017 | Ljungblad et al. |
| 2017/0294288 A1 | 10/2017 | Lock |
| 2017/0341141 A1 | 11/2017 | Ackelid |
| 2017/0341142 A1 | 11/2017 | Ackelid |
| 2017/0348791 A1 | 12/2017 | Ekberg |
| 2017/0348792 A1 | 12/2017 | Fager |
| 2018/0009033 A1 | 1/2018 | Fager |
| 2018/0154444 A1 | 6/2018 | Jonasson |

FOREIGN PATENT DOCUMENTS

| | | |
|---|---|---|
| CN | 101635210 A | 1/2010 |
| CN | 201693176 U | 1/2011 |
| CN | 101607311 B | 9/2011 |
| CN | 203509463 U | 4/2014 |
| DE | 19952998 A1 | 5/2001 |
| DE | 20305843 U1 | 7/2003 |
| DE | 10235434 A1 | 2/2004 |
| DE | 102005014483 A1 | 10/2006 |
| DE | 202008005417 U1 | 8/2008 |
| DE | 102007018601 A1 | 10/2008 |
| DE | 102007029052 A1 | 1/2009 |
| DE | 102008012064 A1 | 9/2009 |
| DE | 102010041284 A1 | 3/2012 |
| DE | 102011105045 B3 | 6/2012 |
| DE | 102013210242 A1 | 12/2014 |
| EP | 0289116 A1 | 11/1988 |
| EP | 0322257 A2 | 6/1989 |
| EP | 0688262 A1 | 12/1995 |
| EP | 1329937 A2 | 7/2003 |
| EP | 1358994 A1 | 11/2003 |
| EP | 1418013 A1 | 5/2004 |
| EP | 1466718 A2 | 10/2004 |
| EP | 1486318 A2 | 12/2004 |
| EP | 1669143 A1 | 6/2006 |
| EP | 1683593 A2 | 7/2006 |
| EP | 1721725 A1 | 11/2006 |
| EP | 1752240 A1 | 2/2007 |
| EP | 1952932 A2 | 8/2008 |
| EP | 2011631 A1 | 1/2009 |
| EP | 2119530 A1 | 11/2009 |
| EP | 2281677 A1 | 2/2011 |
| EP | 2289652 A1 | 3/2011 |
| EP | 2292357 A1 | 3/2011 |
| EP | 2832474 A1 | 2/2015 |
| FR | 2980380 A1 | 3/2013 |
| JP | H05-171423 A | 7/1993 |
| JP | S6352782 A | 3/1998 |
| JP | 2003241394 A | 8/2003 |
| JP | 2003245981 | 9/2003 |
| JP | 2009006509 A | 1/2009 |
| SE | 524467 C2 | 8/2004 |
| WO | WO 1993/08928 A1 | 5/1993 |
| WO | WO 1996/012607 A1 | 5/1996 |
| WO | WO 1997/37523 A2 | 10/1997 |
| WO | WO 2001/081031 A1 | 11/2001 |
| WO | WO 2001/85386 A2 | 11/2001 |
| WO | WO 2002/008653 A1 | 1/2002 |
| WO | WO 2004/007124 A1 | 1/2004 |
| WO | WO 2004/043680 A2 | 5/2004 |
| WO | WO 2004/054743 A1 | 7/2004 |
| WO | WO 2004/056511 A1 | 7/2004 |
| WO | WO 2004/106041 A2 | 12/2004 |
| WO | WO 2004/108398 A1 | 12/2004 |
| WO | WO 2006/091097 A2 | 8/2006 |
| WO | WO 2006/121374 A1 | 11/2006 |

(56) References Cited

FOREIGN PATENT DOCUMENTS

| WO | WO 2007/112808 A1 | 10/2007 |
|---|---|---|
| WO | WO 2007/147221 A1 | 12/2007 |
| WO | WO 2008/013483 A1 | 1/2008 |
| WO | WO 2008/057844 A1 | 5/2008 |
| WO | WO 2008/074287 A1 | 6/2008 |
| WO | WO 2008/125497 A1 | 10/2008 |
| WO | WO 2008/147306 A1 | 12/2008 |
| WO | WO 2009/000360 A1 | 12/2008 |
| WO | WO 2009/072935 A1 | 6/2009 |
| WO | WO 2009/084991 A1 | 7/2009 |
| WO | WO 2010/095987 A1 | 8/2010 |
| WO | WO 2010/125371 A1 | 11/2010 |
| WO | WO 2011/008143 A1 | 1/2011 |
| WO | WO 2011/011818 A1 | 2/2011 |
| WO | WO 2011/030017 A1 | 3/2011 |
| WO | WO 2011/060312 A2 | 5/2011 |
| WO | WO 2012/102655 A1 | 8/2012 |
| WO | WO 2013/092997 A1 | 6/2013 |
| WO | WO 2013/098050 A1 | 7/2013 |
| WO | WO 2013/098135 A1 | 7/2013 |
| WO | WO 2013/159811 A1 | 10/2013 |
| WO | WO 2013/167194 A1 | 11/2013 |
| WO | WO 2013/178825 A2 | 12/2013 |
| WO | WO 2014/071968 A1 | 5/2014 |
| WO | WO 2014/092651 A1 | 6/2014 |
| WO | WO 2014/095200 A1 | 6/2014 |
| WO | WO 2014/095208 A1 | 6/2014 |
| WO | WO 2014/195068 A1 | 12/2014 |
| WO | WO 2015/032590 A2 | 3/2015 |
| WO | WO 2015/091813 A1 | 6/2015 |
| WO | WO 2015/120168 A1 | 8/2015 |
| WO | WO 2015/142492 A1 | 9/2015 |

OTHER PUBLICATIONS

Gibson, D.W., et al., "Additive Manufacturing Technologies: Rapid Prototyping to Direct Digital Manufacturing", 2010, pp. 126-129, Springer, New York.

Guibas, Leonidas J., et al., "Randomized Incremental Construction of Delaunay and Voronoi Diagrams", Algorithmica, Jun. 1992, pp. 381-413, vol. 7, Issue 1-6, Springer-Verlag, New York.

Klassen, Alexander, et al., "Modelling of Electron Beam Absorption in Complex Geometries", Journal of Physics D: Applied Physics, Jan. 15, 2014, 12 pages, vol. 47, No. 6, Institute of Physics Publishing Ltd., Great Britain.

Motojima, Seiji, et al., "Chemical Vapor Growth of LaB6 Whiskers and Crystals Having a Sharp Tip", Journal of Crystal Growth, vol. 44, No. 1, Aug. 1, 1978 (Aug. 1, 1978), pp. 106-109.

Weigel, TH., et al., "Design and Preparation of Polymeric Scaffolds for Tissue Engineering," Expert Rev. Med. Devices, 2006, pp. 835-851, vol. 3, No. 6, XP002691485.

Yang, et al., "The Design of Scaffolds for Use in Tissue Engineering, Part II, Rapid Prototyping Techniques", Tissue Engineering, 2002, pp. 1-11, vol. 8, No. 1, XP002691484.

International Search Report and Written Opinion dated Mar. 26, 2019 for PCT/EP2018/084944 (19 pages).

H Schultz: "Electron Beam Welding" In: "Woodhead Publishing Series in Welding and Other Joining Technologies Ser." Jan. 1, 1994, Elsevier Science & Technology, XP055565129, ISBN: 978-1-85573-050-2, pp. 7-11.

H Schultz: "Electron Beam Welding" In: "Progress in Quantum Electronics" Jan. 1, 1994, Pergamon Press, Oxford, GB, XP055565505, ISSN: 0079-6727, vol. 30, pp. 26-27.

ENHANCED ELECTRON BEAM GENERATION

CROSS REFERENCE TO RELATED APPLICATIONS

This application claims benefit of U.S. Provisional Patent Application No. 62/609,396, filed on Dec. 22, 2017, the contents of which as are hereby incorporated by reference in their entirety.

BACKGROUND

Related Field

Various embodiments of the present invention relate to an electron beam source, a method for generating electron beams and an additive manufacturing process using such electron beam source.

Description of Related Art

Freeform fabrication or additive manufacturing is a method for forming three-dimensional articles through successive fusion of chosen parts of powder layers applied to a worktable. A method and apparatus according to this technique is disclosed in US 2009/0152771.

Such an apparatus may comprise a work table on which the three-dimensional article is to be formed, a powder dispenser, arranged to lay down a thin layer of powder on the work table for the formation of a powder bed, an energy beam source for delivering an energy beam spot to the powder whereby fusion of the powder takes place, elements for control of the energy beam spot over the powder bed for the formation of a cross section of the three-dimensional article through fusion of parts of the powder bed, and a controlling computer, in which information is stored concerning consecutive cross sections of the three-dimensional article. A three-dimensional article is formed through consecutive fusions of consecutively formed cross sections of powder layers, successively laid down by the powder dispenser.

When building three-dimensional articles with additive manufacturing, which is using en electron beam source for melting the material, contamination of the vacuum chamber and/or the electron beam source may be a problem. The contamination may depend on the material to fuse. Some materials outgas/evaporate very little when being fused or melted, which may be taken care of by the vacuum pump system. However, other materials may outgas/evaporate very much when being fused or melted, which may affect the electron beam source negatively or in worst cases may stop the electron beam generation, which may be a problem. When using an electron beam for delivering energy to the material to be fused in additive manufacturing it is desirable to make it possible to use any type of material irrespective of the evaporation degree of the material when being melted/fused.

In WO 2016/026668 it is disclosed means for stimulating emission in an electron beam source. In the document hydrogen gas is introduced in the electron beam column which is beneficial for electron emissivity for a particular type of filament. Other gases are also disclosed to be introduced in the electron beam column in order to supress contamination of the electron beam filament. However, this particular type of technique will require relatively large amount of gas and in particular a too large amount of gas may be present at or in the vicinity of the filament which may reduce the quality of the electron beam and/or reduce the lifetime of the filament.

BRIEF SUMMARY

Having this background, an object of the invention is to provide methods and associated systems that enable electron beam melting additive manufacturing with the use of an electron beam source which is insensitive to the evaporation degree of the material to be melted and/or the amount of contaminants in the vicinity of the electron beam source. The above-mentioned object is achieved by the features according to the claims contained herein.

According to various embodiments it is provided an electron beam source comprising a cathode, an anode, a means for deflecting an electron beam over a target surface and at least one vacuum pump. The electron beam source further comprising a contraction aperture arranged between the anode and the means for deflecting the electron beam where the contraction aperture is aligned with an aperture in the anode with respect to the cathode and where the contraction aperture is smaller than the aperture in the anode. A first vacuum pump is arranged between the contraction aperture and the anode and a second vacuum pump is arranged above the anode. A gas inlet is provided between the contraction aperture and the means for deflecting the electron beam, wherein a first crossover of the electron beam is arranged above the anode and a second crossover is arranged at or in close proximity to the contraction aperture.

An exemplary and non-limiting advantage of such embodiments is that the gas pressure below the contraction aperture prohibits particles/gas molecules from entering into the area of the cathode element, which otherwise may be harmful for the electron beam source.

In another example embodiment the second crossover of the electron beam is created by at least one first focus lens provided between the anode and the contraction aperture.

An exemplary and non-limiting advantage of such embodiment is that the second crossover may be adjusted by adjusting the settings of the first focus lens. This may be advantageous in cases when the electron beam current is adjusted because a change in electron beam current most often also change the position of the second crossover of the electron beam. With the ability to change the position of the second crossover, the position of the second crossover may be fixed irrespective of the used electron beam current. This in turn may be advantageous since a smaller contraction aperture may be used, which in turn will increase the pressure difference above and below the contraction aperture. In increased pressure difference may result in a better suppression of contamination particles to reach the cathode area at the same time as the mean pressure at or around the cathode area may be kept at a minimum.

In yet another example embodiment of the present invention the electron beam source further comprising a pick-up aperture arranged above and in close proximity to the contraction aperture to sense a pick-up current, wherein the pick-up current is used as an input regulation of the focus lens provided between the anode and the contraction aperture for maintaining the position of the second crossover at or in close proximity to the contraction aperture.

An exemplary and non-limiting advantage of using a pick-up aperture is that the second crossover may be provided at a fixed position irrespective of the electron beam current used. A detected electron beam current at the pick-up aperture may be used as an adjustment signal for the first focus lens. In addition, the pick-up aperture may be used as a calibration tool for making sure that the second crossover is aligned with the contraction aperture. In case of misalignment of the electron beam in the contraction aperture an adjustment of the position of the first focus lens in an X-Y plane may be performed so that no signal is detected. If one is doing that for an essentially the same spot size as the size of the contraction aperture a relatively good alignment may be achieved.

In still another example embodiment the second crossover is regulated from a look-up table.

An exemplary a non-limiting advantage of using a look-up table for regulating the position of the second crossover of the electron beam is that it is extremely quick. As soon as you know which electron beam current to use one immediately knows the setting of the first focus lens for setting the position of the second crossover correctly.

In still another example embodiment of the present invention the mean pressure above the anode in lower than the mean pressure below the anode.

An exemplary and non-limiting advantage of this embodiment is that a middle section which is defined by the anode as the upper restriction and the contraction aperture as a lower restriction will function as a differential pumping section, which will allow higher vacuum levels at or in the vicinity of the cathode compared to if the middle section is not used. The middle section have its own vacuum pump as the upper section has where the cathode element is arranged. The middle section takes care of the gas atoms that may escape through the contraction aperture.

BRIEF DESCRIPTION OF THE SEVERAL VIEWS OF THE DRAWINGS

Having thus described the invention in general terms, reference will now be made to the accompanying drawings, which are not necessarily drawn to scale, and wherein:

DETAILED DESCRIPTION OF VARIOUS EMBODIMENTS

Various embodiments of the present invention will now be described more fully hereinafter with reference to the accompanying drawings, in which some, but not all embodiments of the invention are shown. Indeed, embodiments of the invention may be embodied in many different forms and should not be construed as limited to the embodiments set forth herein. Rather, these embodiments are provided so that this disclosure will satisfy applicable legal requirements. Unless otherwise defined, all technical and scientific terms used herein have the same meaning as commonly known and understood by one of ordinary skill in the art to which the invention relates. The term "or" is used herein in both the alternative and conjunctive sense, unless otherwise indicated. Like numbers refer to like elements throughout.

Still further, to facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The term "three-dimensional structures" and the like as used herein refer generally to intended or actually fabricated three-dimensional configurations (e.g., of structural material or materials) that are intended to be used for a particular purpose. Such structures, etc. may, for example, be designed with the aid of a three-dimensional CAD system.

The term "electron beam" as used herein in various embodiments refers to any charged particle beam. The sources of charged particle beam can include an electron gun, a linear accelerator and so on.

Figure 2:
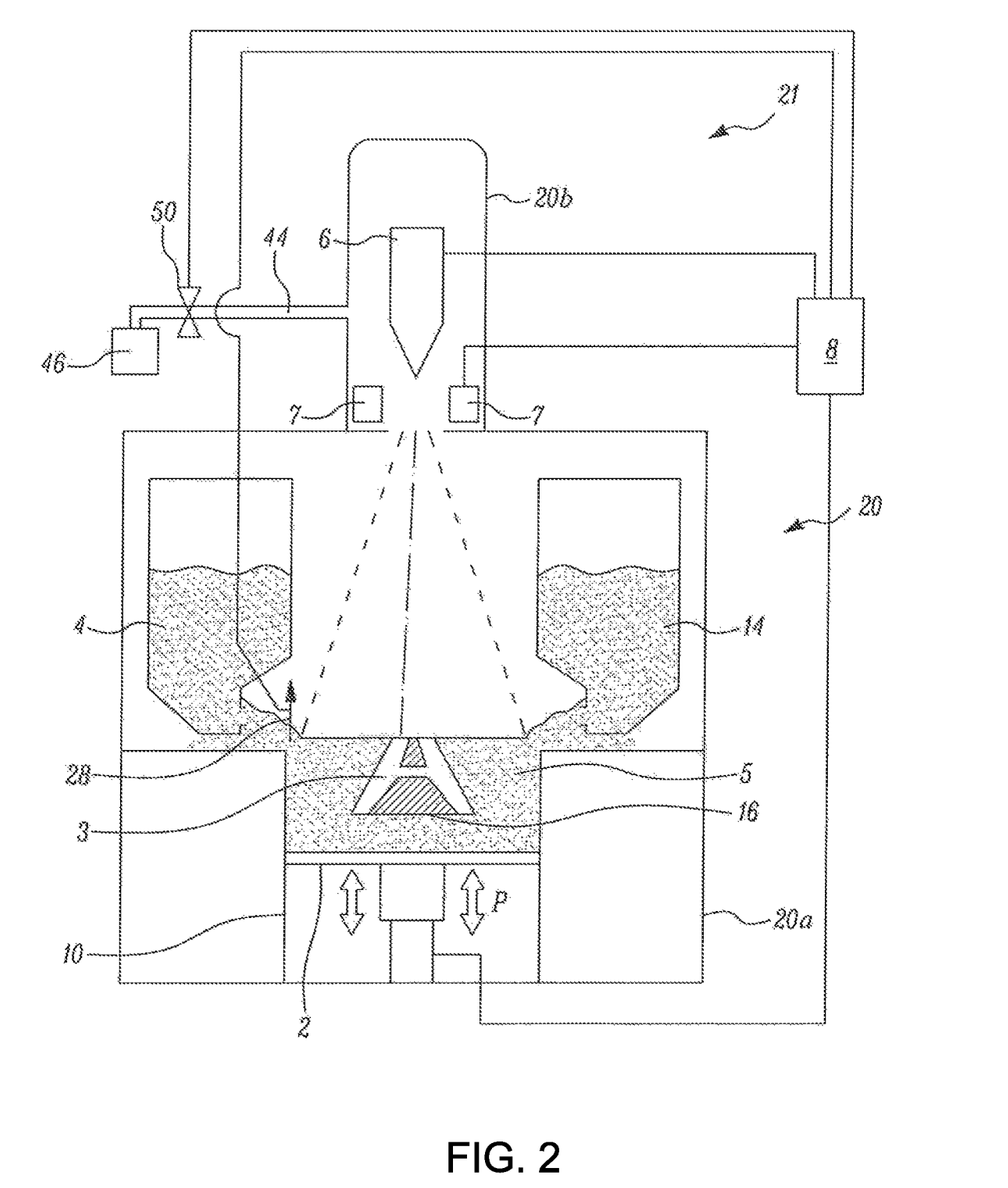
FIG. 2 depicts a schematic illustration of prior art electron beam melting additive manufacturing apparatus in which the inventive electron beam source may be used.

FIG. 2 depicts an example embodiment of a freeform fabrication or additive manufacturing apparatus 21 according to prior art in which the inventive electron beam source may be used. The apparatus 21 comprising an electron beam gun 6; electron beam optics 7; two powder hoppers 4, 14; a build platform 2; a build tank 10; a powder distributor 28; a powder bed 5; a vacuum chamber 20, a control unit 8, and a gas inlet 44.

The vacuum chamber 20 may be capable of maintaining a vacuum environment by means of or via a vacuum system, which system may comprise a turbo molecular pump, a scroll pump, an ion pump and one or more valves which are well known to a skilled person in the art and therefore need no further explanation in this context. The vacuum system may be controlled by the control unit 8. Individual layers of powder material that are fused together are provided in a first section 20a of the vacuum chamber 20. The electron beam source is provided in a second section 20b of the vacuum chamber 20, wherein the first section 20a and the second section 20b are openly connected to each other.

The electron beam gun 6 is generating an electron beam which is used for pre-heating of the powder, melting or fusing together powder material provided on the build platform 2 and/or post heat treatment of the already fused powder material. The electron beam gun 6 is provided in the second section 20b of the vacuum chamber 20. The control unit 8 may be used for controlling and managing the electron beam emitted from the electron beam gun 6.

The electron beam optics 7 may comprise at least one focusing coil, at least one deflection coil 7 and optionally at least one coil for astigmatic correction.

An electron beam power supply (not shown) may be electrically connected to the control unit 8. In an example embodiment of the invention the electron beam gun 6 may generate a focusable electron beam with an accelerating voltage of about 15-60 kV and with a beam power in the range of 3-10 kW. The pressure in the first section 20a of the vacuum chamber 20 may be $1 \times 10^{-3}$ mbar or lower when building the three-dimensional article by fusing the powder layer by layer with the electron beam.

An electron beam generation cathode may be a thermionic cathode made of wolfram, an alkaline earth metal hexaboride such as Lithium hexaboride, Sodium hexaboride, Potassium hexaboride, Rubidium hexaboride, Caesium hexaboride or Francium hexaboride, or a rare earth metal hexaboride such as Scandium hexaboride, Yttrium hexaboride, Lanthanum hexaboride, Cerium hexaboride, Praseodymium hexaboride, Neodymium hexaboride, Promethium hexaboride, Samarium hexaboride, Europium hexaboride, Gadolinium hexaboride, Terbium hexaboride, Dysprosium hexaboride, Holmium hexaboride, Erbium hexaboride, Thulium hexaboride, Ytterbium haxaboride, Lutetium hexaboride.

An electron beam may be directed from the at least one electron beam source over the work table to fuse in first selected locations according to a model to form a first cross section of a three-dimensional article while supplying a gas to the second section of the vacuum chamber. The beam is directed over the build platform 2 from instructions given by the control unit 8. In the control unit 8 instructions for how to control the electron beam for each layer of the three-dimensional article is stored. The first layer of the three dimensional article 3 may be built on the build platform 2, which may be removable, in the powder bed 5 or on an optional start plate. The start plate may be arranged directly on the build platform 2 or on top of a powder bed 5 which is provided on the build platform 2. The gas may be stored in a gas tank 46 and connected to the second section 20b of the vacuum chamber 20 via a pipe 44. A valve 50 may be provided on the pipe 44, which may be controlled by the control unit 8.

The gas that is provided into the second section 20b of the vacuum chamber may be an inert gas such as nitrogen or a pure noble gas such as helium, neon, argon, krypton, xenon or radon or a mixed gas such as a mixture of different noble gases or a mixture of a noble gas with nitrogen. In another example embodiment the gas may be hydrogen, oxygen and/or helium.

According to prior art, the pressure in the second section 20b of the vacuum chamber 20 is somewhat higher than the pressure in the first section 20a of the vacuum chamber 20 during manufacturing of the three-dimensional article. In an example embodiment the pressure in the second section 20b may be $2 \times 10^{-3}$ mBar, while the pressure in the first section 20a may be $1 \times 10^{-3}$ mBar. The control unit may control via the valve 50 the amount of gas that will be provided into the second section for maintaining a sufficient predetermined pressure in the second section.

This increased pressure at or in the vicinity of the cathode is a problem regarding lifetime of the cathode which the present invention seeks to overcome.

Figure 1:
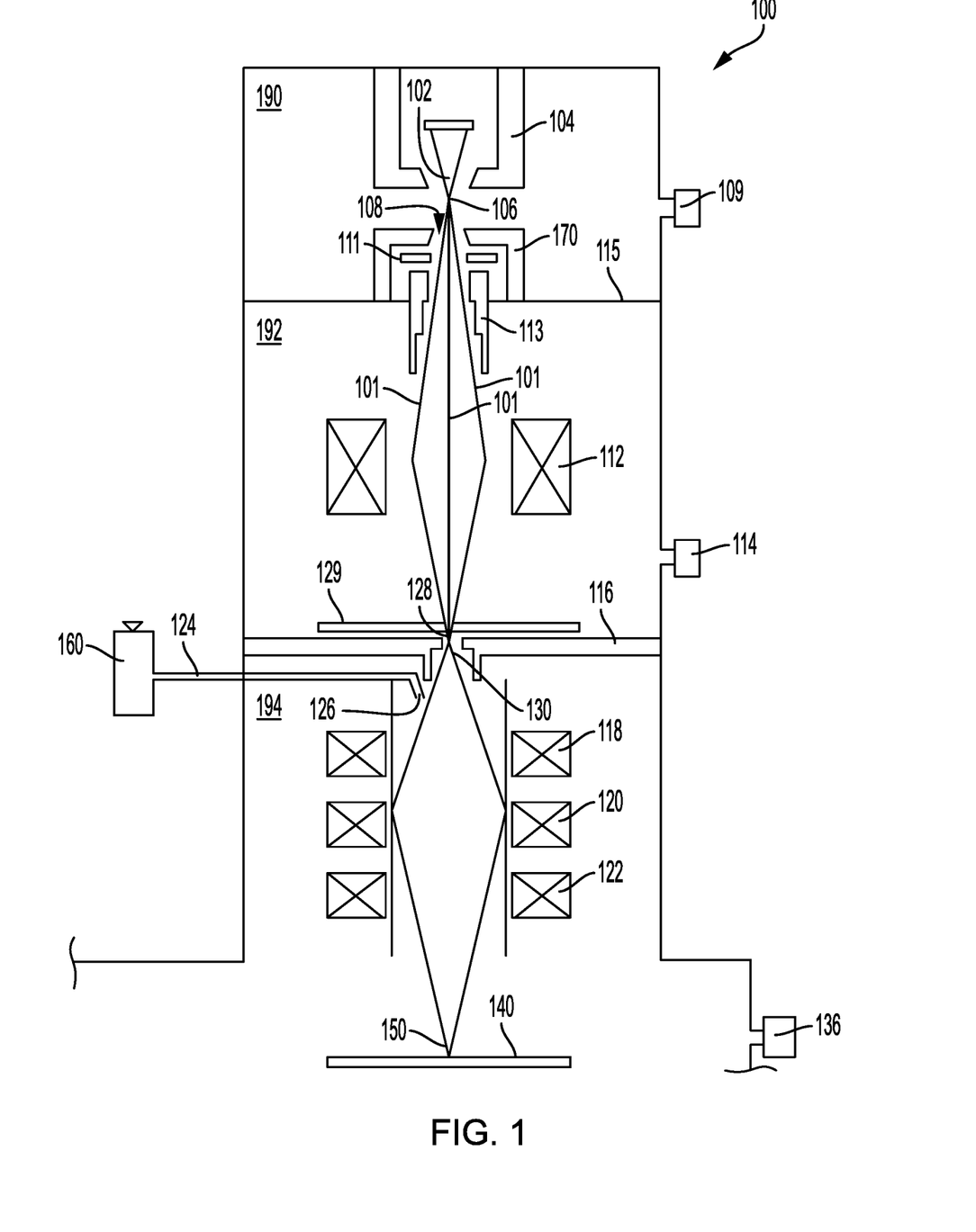
FIG. 1 depicts an example embodiment of an electron beam source according to the present invention.

Instead of two powder hoppers as depicted in FIG. 1 only one powder hopper may be used. Alternatively powder may be provided by other known methods for instance, one or two powder storage(s) beside the build container with a height adjustable platform for delivering a predetermined amount of powder by adjusting the height of the height adjustable platform. Powder is then raked from the powder container to the build container by a doctor blade or a powder rake.

The powder distributor 28 is arranged to lay down a thin layer of the powder material on the build platform 2. During a work cycle the build platform 2 will be lowered successively in relation to a fixed point in the vacuum chamber. In order to make this movement possible, the build platform 2 is in one embodiment of the invention arranged movably in vertical direction, i.e., in the direction indicated by arrow P. This means that the build platform 2 starts in an initial position, in which a first powder material layer of necessary thickness has been laid down. Means for lowering the build platform 2 may for instance be through a servo engine equipped with a gear, adjusting screws etc. The servo engine may be connected to the control unit 8.

After a first layer is finished, i.e., the fusion of powder material for making a first layer of the three-dimensional article, a second powder layer is provided on the build platform 2. The thickness of the second layer may be determined by the distance the build platform is lowered in relation to the position where the first layer was built.

After having distributed the second powder layer on the build platform, the energy beam is directed over the work table causing the second powder layer to fuse in selected locations to form a second cross section of the three-dimensional article. Fused portions in the second layer may be bonded to fused portions of the first layer. The fused portions in the first and second layer may be melted together by melting not only the powder in the uppermost layer but also remelting at least a fraction of a thickness of a layer directly below the uppermost layer.

The three-dimensional article which is formed through successive fusion of parts of a powder bed, which parts corresponds to successive cross sections of the three-dimensional article, comprising a step of providing a model of the three dimensional article. The model may be generated via a CAD (Computer Aided Design) tool.

A first powder layer may be provided on the work table 316 by distributing powder evenly over the worktable according to several methods. One way to distribute the powder is to collect material fallen down from the hopper 306, 307 by a rake system. The rake is moved over the build tank thereby distributing the powder over the start plate. The distance between a lower part of the rake and the upper part of the start plate or previous powder layer determines the thickness of powder distributed over the start plate. The powder layer thickness can easily be adjusted by adjusting the height of the build platform 314.

FIG. 1 depicts an example embodiment of an electron beam source 100 according to the present invention. The electron beam source 100 comprising a cathode 102, an anode 170, a means for deflecting an electron beam over a target surface 140. The means for deflecting the electron beam may be one or a plurality of deflection coils 122.

The electron beam source 100 further comprising a first 109 and a second 114 vacuum pump. The first vacuum pump is arranged above the anode 170 and the second vacuum pump is arranged between the anode 170 and a contraction aperture 128.

The contraction aperture 128 is arranged between the anode 170 and the means for deflecting the electron beam, i.e., the at least one deflection coil 122. The contraction aperture 128 is aligned with an aperture 108 in the anode 170 with respect to the cathode 102. The contraction aperture 128 is smaller than the aperture 108 in the anode 170.

A gas inlet 126 is provided between the contraction aperture 128 and the means for deflecting the electron beam. A first crossover 106 of the electron beam 101 is arranged above the anode 170 and a second crossover 130 is arranged at or in close proximity to the contraction aperture 128. The gas inlet is connected to a gas supply 160 via a pipe 124 and means (not shown) for regulating the pressure and flow of the gas into the electron beam gun. The means for regulating the pressure and flow may be one or a plurality of valves connected to a control unit (not shown).

In FIG. 1 it is depicted a triode or diode electron beam source, having the cathode 102, the anode 170 and grid 104. The invention works equally well for a diode electron beam source having the cathode 102 and the anode 170 and optionally a fixed grid as with a triode where the grid is the regulation source for the electron beam current. In the diode electron beam source, the electron beam current is regulated by changing the heat of the cathode, the hotter the cathode the higher the electron beam current and vice versa. In both the triode and diode case, the first crossover may be arranged at or above the anode 170. In the triode, the first crossover may be at any position between the cathode and the anode. The position, shape and voltage applied to the grid 104 determines the position of the crossover. In the diode, the crossover is depending on the shape of the cathode 102 and on the fixed potential of the grid if the grid is present. In case of parallel electron beams 101 from the cathode 102, the first crossover (which is a virtual crossover) is at an infinite distance above the cathode 102. In case of diverging electron beams 101, the virtual crossover is arranged at a finite distance above the cathode 102. In case of converging electron beams the crossover is arranged in between the anode and the cathode. In an example embodiment the second crossover may be arranged a few mm below the contraction aperture 128.

The electron beam source in FIG. 1 has further an optional ion trap 111 arranged for trapping ions so that such ions may not reach the cathode. The optional ion trap may be a plate having an aperture for the electron beam 101. The ion trap may be set to a negative potential at about 200V.

The electron beam source 100 in FIG. 1 further has an optional drift tube for restricting the electron beam divergence.

The electron beam source 100 is essentially divided in to three sections. The top section 190 being the part above first boundary 115, a middle section 192 between the first boundary 115 and a second boundary 116 and a bottom section 194 being the part below the second boundary 116. The top section 190 has the first vacuum pump 109. The first boundary 115 may be arranged beneath the anode 170. The top section 190 may have a mean vacuum when in operation in the range of $1\times10^{-6}$ to $1\text{-}10^{-8}$ mBar. The second boundary 116 may be an extension of a contraction aperture plate 116. The middle section 192 has the second vacuum pump 114. The middle section 192 may have a mean vacuum when in operation in the range of $1\times10^{-5}$ to $9\text{-}10^{-5}$ mBar. The bottom section 194, which is directly connected to where the target surface 140 is located, may have a mean vacuum when in operation in the range of $1\times10^{-3}$ to $1\text{-}10^{-4}$ mBar.

A first focusing lens 112, which may be one or a plurality of focusing lenses, is arranged in sad middle section 192. The first focusing lens 112 has the function of focusing the electron beams 101 so as to fit in the small contraction aperture 128. The second crossover 130 may be arranged at or in close proximity to the contraction aperture 128, meaning that the actual second crossover 130 may be allowed to be a few mm above or below the contraction aperture 128.

A pick-up plate 129 having an aperture may be arranged above and in close proximity to the contraction aperture 128. The aperture of the pick-up plate 129 may essentially be aligned to the contraction aperture 128. The aperture of the pick-up plate 129 may have essentially the same diameter as the contraction aperture 128. The pick-up plate 129 may sense any electrons that are not passing the aperture in the pick-up plate 129, i.e., it is a measure of the electrons not passing the contraction aperture 128. The number of electrons not passing the pick-up plate 129 may be transformed to a steering signal for the first focus lens 112.

In an initial stage when the electron beam source is calibrated, the pick up plate 129 may be used to adjust the position of the first focus lens 112 in order for the electron beams to be aligned with the contraction aperture, i.e., the center of the contraction aperture to be centered with the center of the electron beams. Later on, the pick up plate may be used for maintaining the position of the second crossover at or in close proximity to the contraction aperture. This may be done by sending the sensed signal of the pick-up plate 129 to the first focus lens 112. This signal may change the setting of the first focus lens 112 when the electron beam current is altered. A change in electron beam current will most likely also change the position of the second crossover 130 and by sensing how much the second crossover 130 is moved by the pick-up plate 129 it is possible to make adjustment to the focus lens 112 in order to maintain a desired position of the second crossover 130 irrespective of the applied electron beam current. This adjustment may be an active adjustment, i.e., both measurement and correction is made on the fly. Alternatively, a look-up table is created when calibrating the electron beam source 100. As soon as the grid 104 is changed for applying a predetermined electron beam current, or in the diode case when the cathode 102 temperature is changed for achieving a desired electron beam current, the temperature of the cathode 102 or the grid potential have a direct corresponding correction value for the first focus lens 112 in order to maintain the second crossover 130 at a fixed position.

The middle section 192 is openly connected to the top section 190 via the aperture 108 in the anode 170. The middle section 192 is openly connected to the bottom section 194 via the contraction aperture 128. When gas is let into the bottom section 194 of the electron beam source 100 through the gas inlet 126, the pressure in the bottom section 194 will act as a plug for contaminants that may escape from the target surface 140 or any other position below the bottom section 194 of the electron beam source. In an additive manufacturing apparatus the target surface is powder material which is to be fused. A third vacuum pump 136 may be arranged in a vacuum chamber (20 in FIG. 2) enclosing the target surface 140 for maintaining the desired vacuum conditions at or near the target surface 140. The aperture 108 of the anode 170 and the contraction aperture 128 determines the vacuum conditions for the middle section 192 together with the second vacuum pump 114. In an example embodiment the contraction aperture 128 is smaller than the aperture 108 in the anode 170.

In an example embodiment the aperture 108 of the anode 170 is 3.2 mm in diameter and the diameter of the contraction aperture 128 is 2 mm. A diameter of the aperture 108 of the anode 170 may be in the range of 2-3.5 mm. A diameter of the contraction aperture 128 may be in the range of 1-2 mm.

By letting helium or another inert gas into the bottom section 194 via the gas inlet 126, the local pressure in the bottom section is increased which will decrease the mean free path for contamination particles that may have its way up towards the cathode element. The contraction aperture restricts a great deal of the gas atoms to reach the middle section. The second vacuum pump 114 and the third vacuum pump 136 is preferably as far away as possible from the gas inlet 126. The higher local pressure in the bottom section 194 will redirect any metallization particles or uncharged residual gas particles, allowing the top section 190 and middle section 192 to stay essentially uncontaminated. With a good suppression of metallization and reactive residual gases the electron emission may be robust and the cathode element will last longer.

The electron beam source further comprising at least one astigmatism lens 118 for correcting any deviations of the shape of the electron beam spot 150 on the target surface from the desired shape and at least one focus lens 120 for changing the size of the beam spot 150 on the target surface 140.

In another aspect of the invention it is provided a method for forming a three-dimensional article through successively depositing individual layers of powder material that are fused together with an electron beam from an electron beam source so as to form the article. The method comprising a first step of providing a contraction aperture arranged between an anode and means for deflecting the electron beam, where contraction aperture is aligned with an aperture in the anode with respect to a cathode of the electron beam source and where the contraction aperture is smaller than the aperture of the anode. The means for deflecting the electron beam is one or a plurality of deflection coils or deflection lenses.

A second step of providing a first crossover of the electron beam above the anode. The first crossover may be a virtual or real crossover.

A third step of providing a first vacuum pump between the contraction aperture and the anode and a second vacuum pump provided above the anode.

A fourth step of providing a second crossover at or in close proximity to the contraction aperture. The second crossover is created by the first focusing lens 112 arranged in the middle section 192.

A fifth step of providing a gas into the electron beam source, wherein a gas inlet is arranged between the contraction aperture and means for deflecting the electron beam.

In another aspect of the invention it is provided a program element configured and arranged when executed on a computer to implement a method as described herein. The program element may be installed in a computer readable storage medium. The computer readable storage medium may be any one of the control units described elsewhere herein or another and separate control unit, as may be desirable. The computer readable storage medium and the program element, which may comprise computer-readable program code portions embodied therein, may further be contained within a non-transitory computer program product. Further details regarding these features and configurations are provided, in turn, below.

As mentioned, various embodiments of the present invention may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, and/or similar terms used herein interchangeably). Such non-transitory computer-readable storage media include all computer-readable media (including volatile and non-volatile media).

In one embodiment, a non-volatile computer-readable storage medium may include a floppy disk, flexible disk, hard disk, solid-state storage (SSS) (e.g., a solid state drive (SSD), solid state card (SSC), solid state module (SSM)), enterprise flash drive, magnetic tape, or any other non-transitory magnetic medium, and/or the like. A non-volatile computer-readable storage medium may also include a punch card, paper tape, optical mark sheet (or any other physical medium with patterns of holes or other optically recognizable indicia), compact disc read only memory (CD-ROM), compact disc compact disc-rewritable (CD-RW), digital versatile disc (DVD), Blu-ray disc (BD), any other non-transitory optical medium, and/or the like. Such a non-volatile computer-readable storage medium may also include read-only memory (ROM), programmable read-only memory (PROM), erasable programmable read-only memory (EPROM), electrically erasable programmable read-only memory (EEPROM), flash memory (e.g., Serial, NAND, NOR, and/or the like), multimedia memory cards (MMC), secure digital (SD) memory cards, SmartMedia cards, CompactFlash (CF) cards, Memory Sticks, and/or the like. Further, a non-volatile computer-readable storage medium may also include conductive-bridging random access memory (CBRAM), phase-change random access memory (PRAM), ferroelectric random-access memory (FeRAM), non-volatile random-access memory (NVRAM), magnetoresistive random-access memory (MRAM), resistive random-access memory (RRAM), Silicon-Oxide-Nitride-Oxide-Silicon memory (SONOS), floating junction gate random access memory (FJG RAM), Millipede memory, racetrack memory, and/or the like.

In one embodiment, a volatile computer-readable storage medium may include random access memory (RAM), dynamic random access memory (DRAM), static random access memory (SRAM), fast page mode dynamic random access memory (FPM DRAM), extended data-out dynamic random access memory (EDO DRAM), synchronous dynamic random access memory (SDRAM), double data rate synchronous dynamic random access memory (DDR SDRAM), double data rate type two synchronous dynamic random access memory (DDR2 SDRAM), double data rate type three synchronous dynamic random access memory (DDR3 SDRAM), Rambus dynamic random access memory (RDRAM), Twin Transistor RAM (TTRAM), Thyristor RAM (T-RAM), Zero-capacitor (Z-RAM), Rambus in-line memory module (RIMM), dual in-line memory module (DIMM), single in-line memory module (SIMM), video random access memory VRAM, cache memory (including various levels), flash memory, register memory, and/or the like. It will be appreciated that where embodiments are described to use a computer-readable storage medium, other types of computer-readable storage media may be substituted for or used in addition to the computer-readable storage media described above.

As should be appreciated, various embodiments of the present invention may also be implemented as methods, apparatus, systems, computing devices, computing entities, and/or the like, as have been described elsewhere herein. As such, embodiments of the present invention may take the form of an apparatus, system, computing device, computing entity, and/or the like executing instructions stored on a computer-readable storage medium to perform certain steps or operations. However, embodiments of the present invention may also take the form of an entirely hardware embodiment performing certain steps or operations.

Various embodiments are described below with reference to block diagrams and flowchart illustrations of apparatuses, methods, systems, and computer program products. It should be understood that each block of any of the block diagrams and flowchart illustrations, respectively, may be implemented in part by computer program instructions, e.g., as logical steps or operations executing on a processor in a computing system. These computer program instructions may be loaded onto a computer, such as a special purpose computer or other programmable data processing apparatus to produce a specifically-configured machine, such that the instructions which execute on the computer or other programmable data processing apparatus implement the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the functionality specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide operations for implementing the functions specified in the flowchart block or blocks.

Accordingly, blocks of the block diagrams and flowchart illustrations support various combinations for performing the specified functions, combinations of operations for performing the specified functions and program instructions for performing the specified functions. It should also be understood that each block of the block diagrams and flowchart illustrations, and combinations of blocks in the block diagrams and flowchart illustrations, could be implemented by special purpose hardware-based computer systems that perform the specified functions or operations, or combinations of special purpose hardware and computer instructions.

Figure 3:
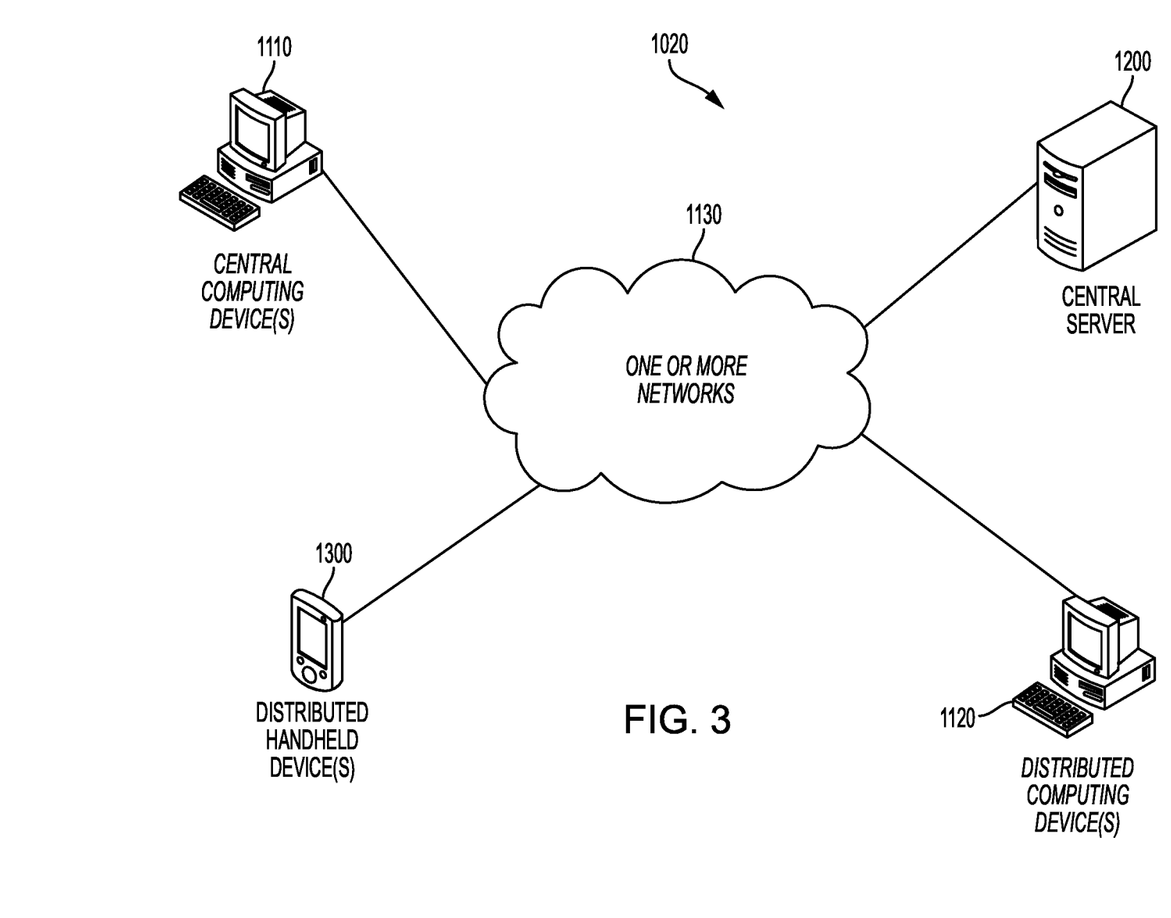
FIG. 3 is a block diagram of an exemplary system 1020 according to various embodiments.

FIG. 3 is a block diagram of an exemplary system 1020 that can be used in conjunction with various embodiments of the present invention. In at least the illustrated embodiment, the system 1020 may include one or more central computing devices 1110, one or more distributed computing devices 1120, and one or more distributed handheld or mobile devices 1300, all configured in communication with a central server 1200 (or control unit) via one or more networks 1130. While FIG. 3 illustrates the various system entities as separate, standalone entities, the various embodiments are not limited to this particular architecture.

According to various embodiments of the present invention, the one or more networks 1130 may be capable of supporting communication in accordance with any one or more of a number of second-generation (2G), 2.5G, third-generation (3G), and/or fourth-generation (4G) mobile communication protocols, or the like. More particularly, the one or more networks 1130 may be capable of supporting communication in accordance with 2G wireless communication protocols IS-136 (TDMA), GSM, and IS-95 (CDMA). Also, for example, the one or more networks 1130 may be capable of supporting communication in accordance with 2.5G wireless communication protocols GPRS, Enhanced Data GSM Environment (EDGE), or the like. In addition, for example, the one or more networks 1130 may be capable of supporting communication in accordance with 3G wireless communication protocols such as Universal Mobile Telephone System (UMTS) network employing Wideband Code Division Multiple Access (WCDMA) radio access technology. Some narrow-band AMPS (NAMPS), as well as TACS, network(s) may also benefit from embodiments of the present invention, as should dual or higher mode mobile stations (e.g., digital/analog or TDMA/CDMA/analog phones). As yet another example, each of the components of the system 1020 may be configured to communicate with one another in accordance with techniques such as, for example, radio frequency (RF), Bluetooth™ infrared (IrDA), or any of a number of different wired or wireless networking techniques, including a wired or wireless Personal Area Network ("PAN"), Local Area Network ("LAN"), Metropolitan Area Network ("MAN"), Wide Area Network ("WAN"), or the like.

Although the device(s) 1110-1300 are illustrated in FIG. 3 as communicating with one another over the same network 1130, these devices may likewise communicate over multiple, separate networks.

According to one embodiment, in addition to receiving data from the server 1200, the distributed devices 1110, 1120, and/or 1300 may be further configured to collect and transmit data on their own. In various embodiments, the devices 1110, 1120, and/or 1300 may be capable of receiving data via one or more input units or devices, such as a keypad, touchpad, barcode scanner, radio frequency identification (RFID) reader, interface card (e.g., modem, etc.) or receiver. The devices 1110, 1120, and/or 1300 may further be capable of storing data to one or more volatile or non-volatile memory modules, and outputting the data via one or more output units or devices, for example, by displaying data to the user operating the device, or by transmitting data, for example over the one or more networks 1130.

In various embodiments, the server 1200 includes various systems for performing one or more functions in accordance with various embodiments of the present invention, including those more particularly shown and described herein. It should be understood, however, that the server 1200 might include a variety of alternative devices for performing one or more like functions, without departing from the spirit and scope of the present invention. For example, at least a portion of the server 1200, in certain embodiments, may be located on the distributed device(s) 1110, 1120, and/or the handheld or mobile device(s) 1300, as may be desirable for particular applications. As will be described in further detail below, in at least one embodiment, the handheld or mobile device(s) 1300 may contain one or more mobile applications 1330 which may be configured so as to provide a user interface for communication with the server 1200, all as will be likewise described in further detail below.

Figure 4A:
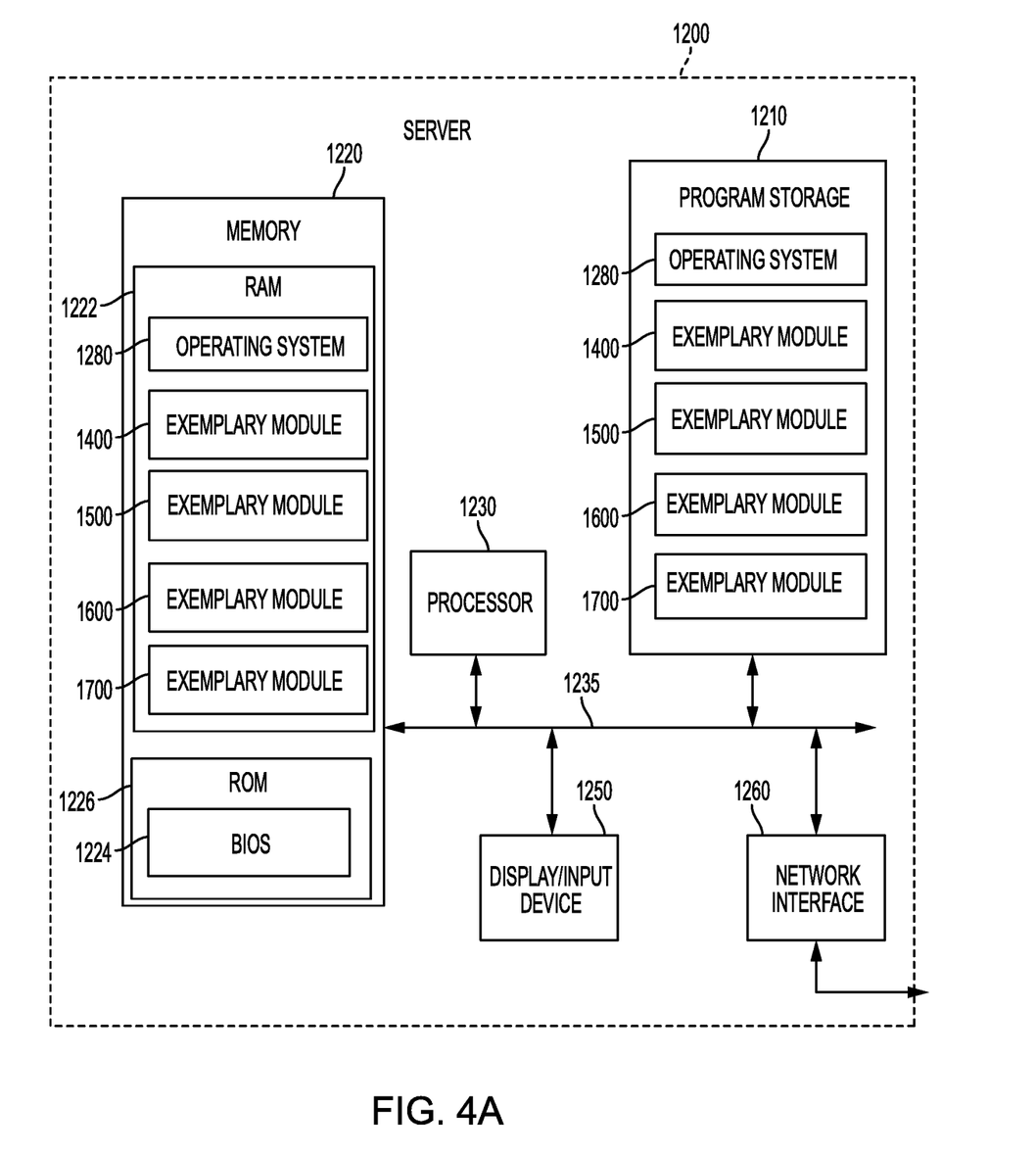
FIG. 4A is a schematic block diagram of a server 1200 according to various embodiments.

FIG. 4A is a schematic diagram of the server 1200 according to various embodiments. The server 1200 includes a processor 1230 that communicates with other elements within the server via a system interface or bus 1235. Also included in the server 1200 is a display/input device 1250 for receiving and displaying data. This display/input device 1250 may be, for example, a keyboard or pointing device that is used in combination with a monitor. The server 1200 further includes memory 1220, which typically includes both read only memory (ROM) 1226 and random access memory (RAM) 1222. The server's ROM 1226 is used to store a basic input/output system 1224 (BIOS), containing the basic routines that help to transfer information between elements within the server 1200. Various ROM and RAM configurations have been previously described herein.

In addition, the server 1200 includes at least one storage device or program storage 210, such as a hard disk drive, a floppy disk drive, a CD Rom drive, or optical disk drive, for storing information on various computer-readable media, such as a hard disk, a removable magnetic disk, or a CD-ROM disk. As will be appreciated by one of ordinary skill in the art, each of these storage devices 1210 are connected to the system bus 1235 by an appropriate interface. The storage devices 1210 and their associated computer-readable media provide nonvolatile storage for a personal computer. As will be appreciated by one of ordinary skill in the art, the computer-readable media described above could be replaced by any other type of computer-readable media known in the art. Such media include, for example, magnetic cassettes, flash memory cards, digital video disks, and Bernoulli cartridges.

Although not shown, according to an embodiment, the storage device 1210 and/or memory of the server 1200 may further provide the functions of a data storage device, which may store historical and/or current delivery data and delivery conditions that may be accessed by the server 1200. In this regard, the storage device 1210 may comprise one or more databases. The term "database" refers to a structured collection of records or data that is stored in a computer system, such as via a relational database, hierarchical database, or network database and as such, should not be construed in a limiting fashion.

A number of program modules (e.g., exemplary modules 1400-1700) comprising, for example, one or more computer-readable program code portions executable by the processor 1230, may be stored by the various storage devices 1210 and within RAM 1222. Such program modules may also include an operating system 1280. In these and other embodiments, the various modules 1400, 1500, 1600, 1700 control certain aspects of the operation of the server 1200 with the assistance of the processor 1230 and operating system 1280. In still other embodiments, it should be understood that one or more additional and/or alternative modules may also be provided, without departing from the scope and nature of the present invention.

In various embodiments, the program modules 1400, 1500, 1600, 1700 are executed by the server 1200 and are configured to generate one or more graphical user interfaces, reports, instructions, and/or notifications/alerts, all accessible and/or transmittable to various users of the system 1020. In certain embodiments, the user interfaces, reports, instructions, and/or notifications/alerts may be accessible via one or more networks 1130, which may include the Internet or other feasible communications network, as previously discussed.

In various embodiments, it should also be understood that one or more of the modules 1400, 1500, 1600, 1700 may be alternatively and/or additionally (e.g., in duplicate) stored locally on one or more of the devices 1110, 1120, and/or 1300 and may be executed by one or more processors of the same. According to various embodiments, the modules 1400, 1500, 1600, 1700 may send data to, receive data from, and utilize data contained in one or more databases, which may be comprised of one or more separate, linked and/or networked databases.

Also located within the server 1200 is a network interface 1260 for interfacing and communicating with other elements of the one or more networks 1130. It will be appreciated by one of ordinary skill in the art that one or more of the server 1200 components may be located geographically remotely from other server components. Furthermore, one or more of the server 1200 components may be combined, and/or additional components performing functions described herein may also be included in the server.

While the foregoing describes a single processor 1230, as one of ordinary skill in the art will recognize, the server 1200 may comprise multiple processors operating in conjunction with one another to perform the functionality described herein. In addition to the memory 1220, the processor 1230 can also be connected to at least one interface or other means for displaying, transmitting and/or receiving data, content or the like. In this regard, the interface(s) can include at least one communication interface or other means for transmitting and/or receiving data, content or the like, as well as at least one user interface that can include a display and/or a user input interface, as will be described in further detail below. The user input interface, in turn, can comprise any of a number of devices allowing the entity to receive data from a user, such as a keypad, a touch display, a joystick or other input device.

Still further, while reference is made to the "server" 1200, as one of ordinary skill in the art will recognize, embodiments of the present invention are not limited to traditionally defined server architectures. Still further, the system of embodiments of the present invention is not limited to a single server, or similar network entity or mainframe computer system. Other similar architectures including one or more network entities operating in conjunction with one another to provide the functionality described herein may likewise be used without departing from the spirit and scope of embodiments of the present invention. For example, a mesh network of two or more personal computers (PCs), similar electronic devices, or handheld portable devices, collaborating with one another to provide the functionality described herein in association with the server 1200 may likewise be used without departing from the spirit and scope of embodiments of the present invention.

According to various embodiments, many individual steps of a process may or may not be carried out utilizing the computer systems and/or servers described herein, and the degree of computer implementation may vary, as may be desirable and/or beneficial for one or more particular applications.

Figure 4B:
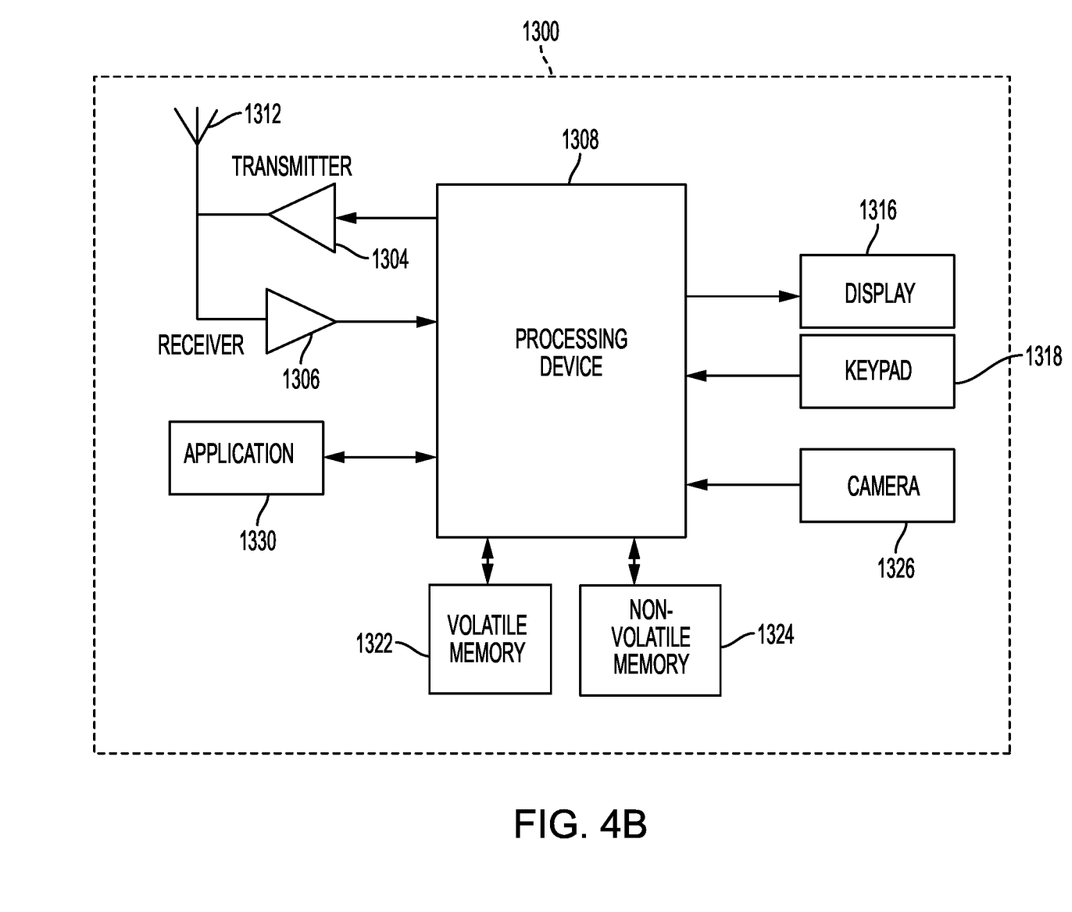
FIG. 4B is a schematic block diagram of an exemplary mobile device 1300 according to various embodiments.

FIG. 4B provides an illustrative schematic representative of a mobile device 1300 that can be used in conjunction with various embodiments of the present invention. Mobile devices 1300 can be operated by various parties. As shown in FIG. 4B, a mobile device 1300 may include an antenna 1312, a transmitter 1304 (e.g., radio), a receiver 1306 (e.g., radio), and a processing element 1308 that provides signals to and receives signals from the transmitter 1304 and receiver 1306, respectively.

The signals provided to and received from the transmitter 1304 and the receiver 1306, respectively, may include signaling data in accordance with an air interface standard of applicable wireless systems to communicate with various entities, such as the server 1200, the distributed devices 1110, 1120, and/or the like. In this regard, the mobile device 1300 may be capable of operating with one or more air interface standards, communication protocols, modulation types, and access types. More particularly, the mobile device 1300 may operate in accordance with any of a number of wireless communication standards and protocols. In a particular embodiment, the mobile device 1300 may operate in accordance with multiple wireless communication standards and protocols, such as GPRS, UMTS, CDMA2000, 1×RTT, WCDMA, TD-SCDMA, LTE, E-UTRAN, EVDO, HSPA, HSDPA, Wi-Fi, WiMAX, UWB, IR protocols, Bluetooth protocols, USB protocols, and/or any other wireless protocol.

Via these communication standards and protocols, the mobile device 1300 may according to various embodiments communicate with various other entities using concepts such as Unstructured Supplementary Service data (USSD), Short Message Service (SMS), Multimedia Messaging Service (MMS), Dual-Tone Multi-Frequency Signaling (DTMF), and/or Subscriber Identity Module Dialer (SIM dialer). The mobile device 1300 can also download changes, add-ons, and updates, for instance, to its firmware, software (e.g., including executable instructions, applications, program modules), and operating system.

According to one embodiment, the mobile device 1300 may include a location determining device and/or functionality. For example, the mobile device 1300 may include a GPS module adapted to acquire, for example, latitude, longitude, altitude, geocode, course, and/or speed data. In one embodiment, the GPS module acquires data, sometimes known as ephemeris data, by identifying the number of satellites in view and the relative positions of those satellites.

The mobile device 1300 may also comprise a user interface (that can include a display 1316 coupled to a processing element 1308) and/or a user input interface (coupled to a processing element 308). The user input interface can comprise any of a number of devices allowing the mobile device 1300 to receive data, such as a keypad 1318 (hard or soft), a touch display, voice or motion interfaces, or other input device. In embodiments including a keypad 1318, the keypad can include (or cause display of) the conventional numeric (0-9) and related keys (#, *), and other keys used for operating the mobile device 1300 and may include a full set of alphabetic keys or set of keys that may be activated to provide a full set of alphanumeric keys. In addition to providing input, the user input interface can be used, for example, to activate or deactivate certain functions, such as screen savers and/or sleep modes.

The mobile device 1300 can also include volatile storage or memory 1322 and/or non-volatile storage or memory 1324, which can be embedded and/or may be removable. For example, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database mapping systems, data, applications, programs, program modules, scripts, source code, object code, byte code, compiled code, interpreted code, machine code, executable instructions, and/or the like to implement the functions of the mobile device 1300.

The mobile device 1300 may also include one or more of a camera 1326 and a mobile application 1330. The camera 1326 may be configured according to various embodiments as an additional and/or alternative data collection feature, whereby one or more items may be read, stored, and/or transmitted by the mobile device 1300 via the camera. The mobile application 1330 may further provide a feature via which various tasks may be performed with the mobile device 1300. Various configurations may be provided, as may be desirable for one or more users of the mobile device 1300 and the system 1020 as a whole.

The invention is not limited to the above-described embodiments and many modifications are possible within the scope of the following claims. Indeed, a person of ordinary skill in the art would be able to use the information contained in the preceding text to modify various embodiments of the invention in ways that are not literally described, but are nevertheless encompassed by the attached claims, for they accomplish substantially the same functions to reach substantially the same results. Therefore, it is to be understood that the invention is not limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An electron beam source comprising:
a cathode,
an anode,
a means for deflecting an electron beam over a target surface,
at least one vacuum pump; and
a contraction aperture arranged between the anode and the means for deflecting the electron beam,
wherein:
the contraction aperture is aligned with an aperture in the anode with respect to the cathode;
the contraction aperture is smaller than the aperture in the anode;
a first vacuum pump is arranged between the contraction aperture and the anode and a second vacuum pump is arranged above the anode;
a gas inlet is provided between the contraction aperture and the means for deflecting the electron beam; and
a first crossover of the electron beam is arranged above the anode and a second crossover is arranged at or in close proximity to the contraction aperture.

2. The electron beam source according to claim 1, wherein the second crossover of the electron beam is created by at least one first focus lens provided between the anode and the contraction aperture.

3. The electron beam source according to claim 2, wherein the focus lens provided between the anode and the contraction aperture is adapted to regulate a position of the second crossover of the electron beam as a function of electron beam current in order to maintain the position of the second crossover at or in close proximity to the contraction aperture.

4. The electron beam source according to claim 3, further comprising a pick-up aperture arranged above and in close proximity to the contraction aperture to sense a pick-up current, wherein the pick-up current is used as an input regulation of the focus lens provided between the anode and the contraction aperture for maintaining the position of the second crossover at or in close proximity to the contraction aperture.

5. The electron beam source according to claim 3, wherein the second crossover is regulated from a look-up table.

6. The electron beam source according to claim 1, wherein the mean pressure above the anode in lower than the mean pressure below the anode.

7. The electron beam source according to claim 1, wherein the size of the contraction aperture is 1-2 mm.

8. The electron beam source according to claim 1, wherein the size of the anode aperture is 2-3.5 mm.

9. The electron beam source according to claim 1, wherein the gas is an inert gas.

10. The electron beam source according to claim 1, wherein the gas inlet is arranged below the contraction aperture and in close proximity to the contraction aperture.

11. The electron beam source according to claim 1, wherein the electron beam source further comprises at least one second focus lens provided below the contraction area for determining a size of the electron beam on the target surface.

12. The electron beam source according to claim 1, wherein the means for deflecting the electron beam is at least one deflection coil.

13. An additive manufacturing machine for making three-dimensional articles by fusing powder material layer by layer, the machine comprising a control unit and an electron beam source according to claim 1.

14. A method for forming a three-dimensional article through successively depositing individual layers of powder material that are fused together with an electron beam from an electron beam source so as to form the article, the method comprising the steps of:
- arranging a contraction aperture between an anode and at least one deflection coil, where the contraction aperture is aligned with an aperture in the anode with respect to a cathode of the electron beam source and where the contraction aperture is smaller than the aperture of the anode;
- arranging a first vacuum pump between the contraction aperture and the anode and a second vacuum pump above the anode;
- conducting a first crossover of the electron beam above the anode,
- conducting a second crossover at or in close proximity to the contraction aperture,
- injecting a gas into the electron beam source, wherein a gas inlet is arranged between the contraction aperture and the at least one deflection coil.

15. The method according to claim 14, wherein the second crossover is created by at least one focusing lens provided between the anode and the contraction aperture.

16. The method according to claim 14, wherein the anode has a larger aperture compared to the contraction aperture.

17. The method according to claim 14, wherein at least the injecting step is conducted via at least one computer processor within a control unit.

18. The method according to claim 17, further comprising the step of at least one of generating or accessing a model of the three-dimensional article to be formed in the vacuum chamber by fusing powder material layer by layer.

19. A computer program product comprising at least one non-transitory computer-readable storage medium having computer-readable program code portions embodied therein, the computer-readable program code portions comprising one or more executable portions configured for:
- directing an electron beam from the at least one electron beam source over the work table to fuse in first selected locations according to the model to form a first cross section of the three-dimensional article
- conducting a first crossover of the electron beam above an anode of the at least one electron beam source,
- conducting a second crossover at or in close proximity to a contraction aperture, which contraction aperture is arranged between the anode and means for deflecting the electron beam, and
- injecting a gas into the electron beam source, wherein a gas inlet is arranged between the contraction aperture and means for deflecting the electron beam and where the contraction aperture is smaller than an aperture of the anode.

20. The computer program product of claim 19, further configured for at least one of generating or accessing a model of the three-dimensional article to be formed in the vacuum chamber by fusing powder material layer by layer.

* * * * *